United States Patent
Chiang et al.

(10) Patent No.: US 6,569,732 B1
(45) Date of Patent: May 27, 2003

(54) INTEGRATED PROCESS SEQUENCE ALLOWING ELIMINATION OF POLYSILICON RESIDUE AND SILICON DAMAGE DURING THE FABRICATION OF A BURIED STACK CAPACITOR STRUCTURE IN A SRAM CELL

(75) Inventors: Min-Hsiung Chiang, Taipei (TW); Chung-Wei Chang, Hsin-Chu (TW); Kuo-Chyuan Tzeng, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/262,926

(22) Filed: Oct. 2, 2002

(51) Int. Cl.[7] .......................................... H01L 21/8242
(52) U.S. Cl. ........................ 438/238; 438/244; 438/275
(58) Field of Search ................................. 438/238, 241, 438/244, 253, 275, 381, 387, 589

(56) References Cited

U.S. PATENT DOCUMENTS

| | | | | |
|---|---|---|---|---|
| 5,716,881 A | * | 2/1998 | Liang et al. | 438/238 |
| 5,866,451 A | * | 2/1999 | Yoo et al. | 438/238 |
| 6,080,638 A | | 6/2000 | Lin et al. | 438/425 |
| 6,150,210 A | | 11/2000 | Arnold | 438/243 |
| 6,251,726 B1 | | 6/2001 | Huang | 438/253 |
| 6,420,226 B1 | | 7/2002 | Chen et al. | 438/238 |
| 6,506,647 B2 | * | 1/2003 | Kuroda et al. | 438/275 |

* cited by examiner

Primary Examiner—Chandra Chaudhari
(74) Attorney, Agent, or Firm—George O. Saile; Stephen B. Ackerman

(57) ABSTRACT

A process sequence for fabricating a buried stack capacitor structure, to be used as a component in a memory cell such as a one transistor SRAM cell, has been developed. The process features formation of a self-aligned opening used to accommodate a subsequent buried stack capacitor structure, with the self-aligned opening defined via selective dry and wet etch procedures, employed to avoid damage to regions of a semiconductor substrate which become exposed at the conclusion of the definition procedure. In addition the process sequence allows a smooth, top surface topography to be present during definition of a polysilicon storage node structure in the self-aligned opening, allowing unwanted portions of polysilicon to be easily removed, reducing the risk of polysilicon stringers.

26 Claims, 6 Drawing Sheets

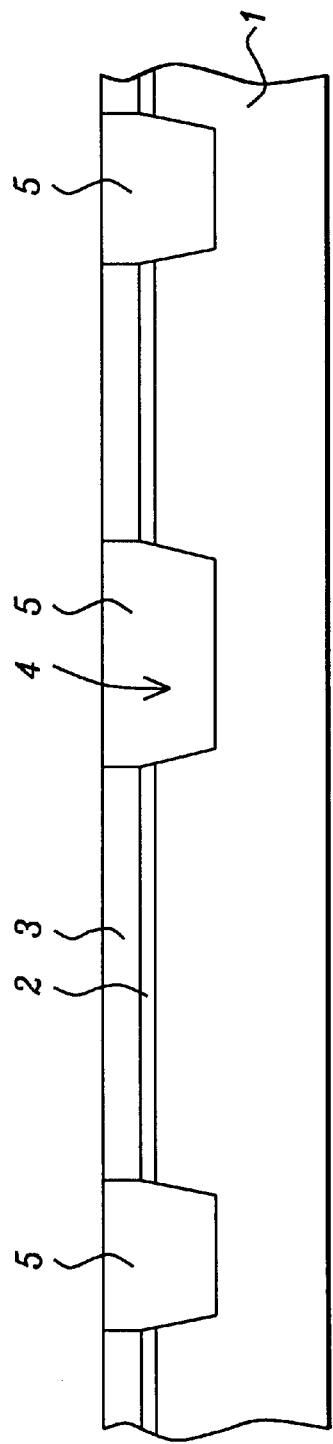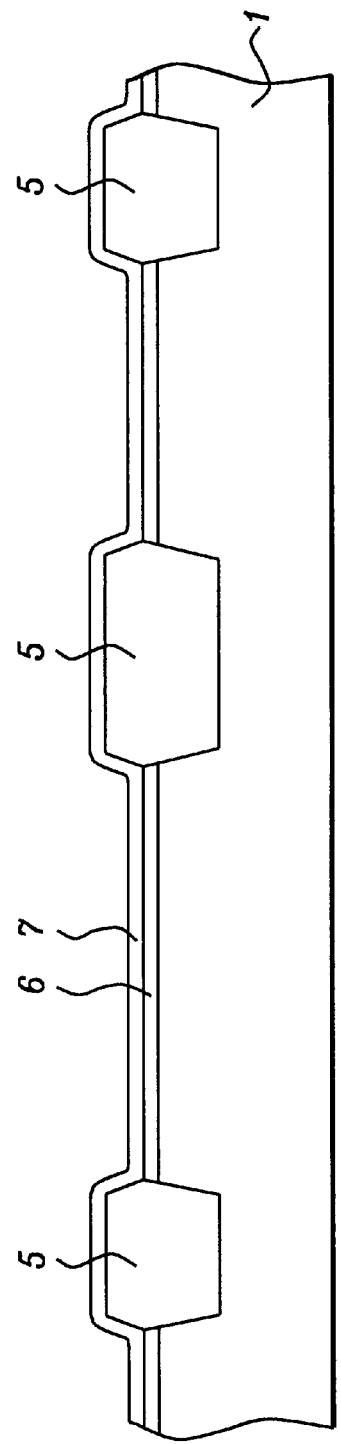
FIG. 1
FIG. 2

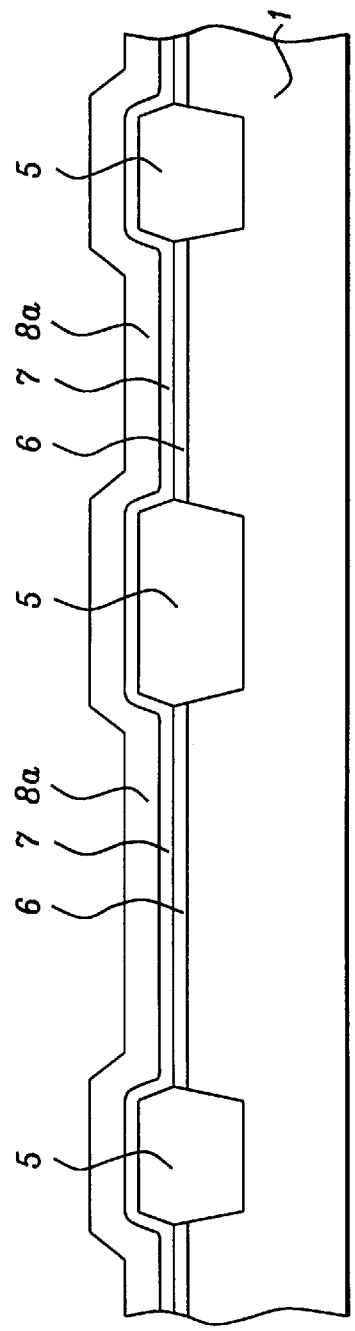
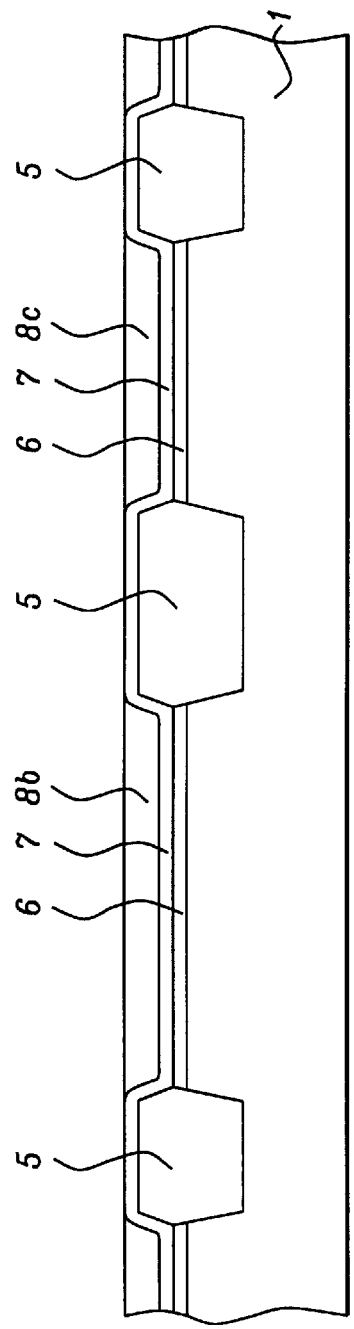
FIG. 3
FIG. 4

INTEGRATED PROCESS SEQUENCE ALLOWING ELIMINATION OF POLYSILICON RESIDUE AND SILICON DAMAGE DURING THE FABRICATION OF A BURIED STACK CAPACITOR STRUCTURE IN A SRAM CELL

RELATED PATENT APPLICATIONS

"A Novel Method of Defining A Buried Stack Capacitor Structure For A One Transistor SRAM Cell", by W. C. Chen et al, of Taiwan Semiconductor Manufacturing Corporation, filed on Dec. 12, 2001, Ser. No. 10/020,753, U.S. Pat. No. 6,420,226 assigned to a common assignee.

BACKGROUND OF THE INVENTION (1) Field of the Invention

The present invention relates to methods used to fabricate semiconductor devices, and more specifically to a method used to form a buried stack capacitor structure for a static random access memory (SRAM), cell.

(2) Description of Prior Art

SRAM cells have in the past been fabricated using six transistors, usually comprised of four N channel, metal oxide semiconductor field effect transistor (MOSFET), devices, and of two P channel MOSFET devices. However to reduce processing costs the semiconductor industry has been attempting to fabricate smaller chips, allowing a greater number of smaller semiconductor chips to be obtained from a specific size starting substrate thus reducing the processing cost of a specific semiconductor chip. The smaller semiconductor chips are designed to offer device densities equal to, or greater than counterpart larger semiconductor chips. However the use of smaller chips for SRAM technology create problems when attempting to place six transistors on the smaller semiconductor chip. Therefore SRAM designs have focused on pseudo type, or a one transistor, 1 T SRAM cell, comprised with a single metal oxide semiconductor field effect transistor (MOSFET) device, and a single capacitor structure. This configuration, featuring a single transistor and a single capacitor structure, provides the same function as the six transistor design, however requiring less space and thus fulfilling the objective of constructing smaller semiconductor chips.

This invention will describe a novel process sequence in which the 1 T SRAM cell is fabricated using a buried stacked capacitor structure, with the buried stacked capacitor structure option requiring less space than a counterpart trench type, or a stacked type capacitor structure. In addition the integrated process described in this invention will feature unique process sequences targeted at eliminating silicon damage, and eliminating polysilicon stringer formation, which can occur during buried stack capacitor fabrication. Prior art such as Arnold, in U.S. Pat. No. 6,150,210, as well as Huang, in U.S. Pat. No. 6,251,726, describe processes for integrating the fabrication of capacitor structures in dynamic random access memory (DRAM) cells. However those prior arts do not describe the novel process features highlighted in this present invention directed at the fabrication of a buried stack capacitor structure, as an component of a 1 T SRAM cell, featuring process sequences designed to eliminate silicon damage and polysilicon stringers which can occur during the integrated process sequence.

SUMMARY OF THE INVENTION

It is an object of this invention to fabricate a buried stack capacitor structure for use in memory cells, such as a static random access memory (SRAM), cell.

It is another object of this invention to define a self-aligned opening for the buried stacked capacitor structure, via use of selective dry etching, and selective wet etching procedures, with the selective etch procedure preventing damage to regions of the semiconductor substrate exposed at the conclusion of the self-aligned opening.

It is still another object of this invention to form an implanted well region for logic applications early in process sequence, after formation of a shallow trench isolation region and after a subsequently formed sacrificial silicon dioxide layer, to avoid damage to capacitor dielectric layer which can occur if well implant procedure is performed after capacitor formation.

It is still yet another object of this invention to use a disposable silicon oxide layer, and a chemical mechanical polishing (CMP) procedure for planarization purposes, allowing definition of a storage node structure, obtained via deposition of, and patterning of a polysilicon layer, to be accomplished without forming polysilicon stringers between the subsequent capacitor structure and adjacent devices.

In accordance with the present invention a method of fabricating a buried stack capacitor structure is described. After formation of silicon oxide filled, STI regions in a semiconductor substrate, a silicon dioxide pad layer is grown on regions of the semiconductor substrate not occupied by the STI regions. A well region, needed for logic applications, is formed in areas of the semiconductor substrate not occupied to the STI regions. A silicon nitride layer, and a silicon oxide layer are then deposited followed by a planarizing CMP procedure, exposing silicon nitride only on the top surface of the STI regions. Selective removal of the exposed portions of silicon nitride result in a planarized top surface featuring composite insulator regions comprised of silicon oxide-silicon nitride-silicon dioxide, located between STI regions. Photolithographic and selective dry etching procedures are used to define an initial self-aligned opening via removal an unprotected top portion of silicon oxide in the STI region, and via selective removal of an unprotected portion of the silicon oxide component of the composite insulator region, located adjacent to the STI region, resulting in exposure of a portion of the silicon nitride component of the composite insulator region. After removal of the masking photoresist shape selective etching procedures are used to remove the portions of silicon nitride and portions of the silicon dioxide pad layer, not covered by a silicon oxide shape which was defined during the initial self aligned opening, resulting in definition of a final self-aligned opening for a buried stack capacitor structure. The portion of the semiconductor substrate exposed in the buried stack capacitor opening, located adjacent to the partially etched STI region, was not damaged as a result of the selective etching procedures used for definition of the final self-aligned opening. After deposition of a first polysilicon layer a photoresist shape is formed in the final self-aligned, buried stack capacitor opening, protecting regions of first polysilicon layer from a CMP procedure used to remove portions of first polysilicon layer from the planarized top surface of the composite insulator region located between STI shapes, the region in which subsequent devices will be formed in, resulting in the definition of the storage node structure of the buried stack capacitor structure. Formation of a capacitor dielectric layer and deposition of a second polysilicon layer, is followed by a patterning procedure applied to the second polysilicon layer, and to the capacitor dielectric layer, resulting in a buried stack capacitor structure, in the final self-aligned opening, comprised of a top plate formed from second polysilicon layer, a capacitor dielectric layer, and the storage node structure defined from first polysilicon layer. The silicon dioxide pad layer protected portions of the underlying semiconductor substrate located between STI regions, from the final capacitor definition procedure.

BRIEF DESCRIPTION OF THE DRAWINGS

The object and other advantages of this invention are best described in the preferred embodiment with reference to the attached drawings that include:

FIGS. 1–12, which schematically, in cross-sectional style, describe key processing stages used to fabricate a buried stack capacitor structure for a SRAM cell, in which specific process sequences are employed to avoid silicon damage created during a well implant procedure, and to avoid formation of polysilicon stringers during the fabrication of the buried stack capacitor structure.

DESCRIPTION OF THE PREFERRED EMBODIMENTS

Figure 5:
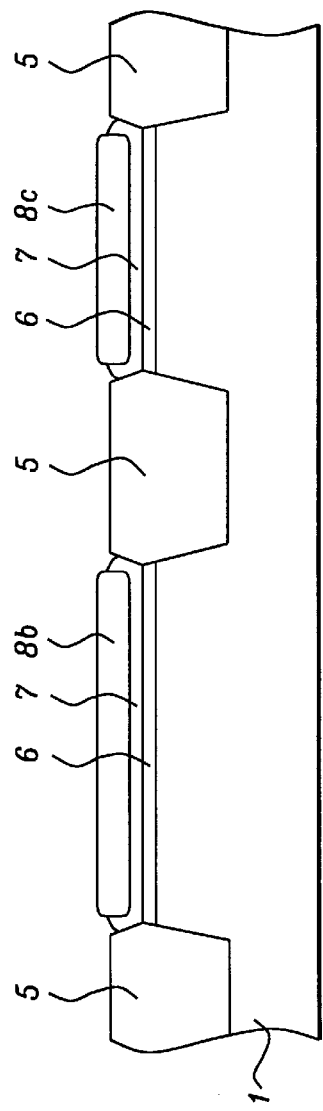

The method of fabricating a buried stacked capacitor structure, to be incorporated into a memory cell such as a one transistor, SRAM cell, will now be described in detail. Semiconductor substrate 1, comprised of P type, single crystalline, featuring a <100> crystallographic orientation, is used and schematically shown in FIG. 1. Silicon dioxide layer 2, is thermally grown on the surface of semiconductor substrate 1, at thickness between about 100 to 200 Angstroms, followed by deposition of silicon nitride layer 3, via low pressure chemical vapor deposition (LPCVD), or plasma enhanced chemical vapor deposition (PECVD), procedures, at a thickness between about 1000 to 2000 Angstroms. A photoresist shape (not shown in the drawings) is next used as a mask to allow a reactive ion etching (RIE) procedure, using $CF_4$ as an etchant for silicon nitride and silicon oxide, and using $Cl_2$ or $SF_6$ as an etchant for silicon, to define shallow trench shapes 4. Shallow trench shapes 4, are defined to a depth between about 3000 to 5000 Angstroms, in semiconductor substrate 1. After removal of the photoresist shape used to define the shallow trench shapes, via plasma oxygen ashing procedures, a silicon oxide layer is deposited via LPCVD or PECVD procedures, to a thickness between about 6000 to 8000 Angstroms, completely filling shallow trench shapes 4. The silicon oxide layer is obtained using tetraethylorthosilicate (TEOS), as a source. If desired a silicon dioxide liner layer can be grown the exposed surfaces of the shallow trench shapes prior to filling with the silicon oxide layer. A chemical mechanical polishing (CMP), procedure is next employed to remove portions of the silicon oxide layer from the top surface of silicon nitride layer 3, resulting in the insulator filled, shallow trench isolation (STI), regions 5, schematically shown in FIG. 1. If desired unwanted portions of the shallow trench filling silicon oxide layer can be selectively removed from the top surface of silicon nitride layer 3, via a selective RIE procedure using $CHF_3$ as an etchant for silicon oxide.

After formation of STI regions 5, silicon nitride layer 3, and silicon dioxide layer 2, are removed, resulting in a top portion of STI regions 5, located above the top surface of semiconductor substrate 1. In addition the procedures used to remove silicon nitride layer 3, and silicon dioxide layer 2, result in a bevelled shape for the sides of STI regions 5. Silicon dioxide layer 6, to be used as a stop layer for a subsequent self aligned opening procedure, is next thermally grown at a thickness between about 100 to 200 Angstroms, on portions of semiconductor substrate 1, not occupied by STI regions 5. A well region (not shown in the drawings), needed for specific logic applications, is next formed in portions of semiconductor substrate 1, not occupied by STI regions 5. The placement of the well implant procedure at this stage of the process sequence avoids the use of an extra photolithographic mask which would be needed at a later stage of the process sequence. In addition the early formation of the implanted well region avoids possible implant damage to capacitor elements such as a capacitor dielectric layer, which can occur if the well implant procedure were performed post-capacitor formation. Silicon nitride layer 7, is next deposited via LPCVD or PECVD procedures, at a thickness between about 100 to 1000 Angstroms. Silicon nitride layer 7, as is the case for silicon dioxide layer 6, will be used for stop layers for a subsequent self-aligned opening procedure, used to accommodate a buried stack capacitor structure. The result of these procedures is schematically illustrated in FIG. 2.

Top surface planarization, needed to avoid formation of polysilicon stringers during subsequent definition of a bottom plate, or storage node structure, is next addressed and schematically shown using FIGS. 3–4. Silicon oxide layer 8a, is deposited to a thickness between about 2000 to 4000 Angstroms, via PECVD procedures, using tetraethylorthosilicate (TEOS) as a source. A CMP procedure is next employed to remove the regions of silicon oxide layer 8a, located on the portions of silicon nitride layer 7, which in turn directly overlay the top surface of STI regions 5. The selective CMP procedure terminates at the appearance of the portions of silicon nitride layer overlying STI regions 5, resulting in silicon oxide shape 8b, located in a region of the memory cell to be used for the active, or MOSFET devices. The CMP procedure also results in the definition of silicon oxide shape 8c, located in the region of the memory cell to be used to accommodate the buried stack capacitor structure. The smooth top surface topography presented by silicon oxide shapes 8b, and STI regions 5, will remain during the definition of a polysilicon bottom plate structure, allowing uncomplicated removal of unwanted portions of polysilicon to be achieved, thus eliminating residual polysilicon or polysilicon stringers which if left remaining would result in leakage or shorts between the buried stack capacitor structure and other active device elements of the memory cell. The portions of silicon nitride layer 7, still residing on the top surface of STI regions 5, used as a stop layer for the CMP planarization procedure, are now selectively removed using either a hot phosphoric acid wet etch procedure or a selective dry etch procedure using $Cl_2$ as the selective etchant for silicon nitride. This is schematically shown in FIG. 5.

Figure 6:
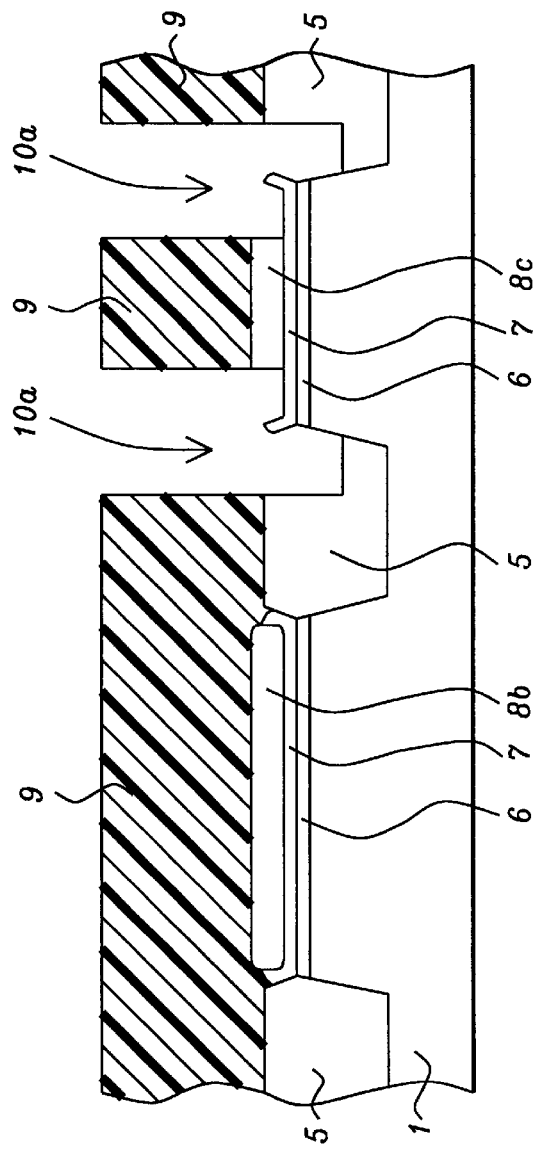

A critical photolithographic and dry etching procedure, defining initial self-aligned opening 10a, to be used to accommodate a storage node component of the buried stacked capacitor structure, is next addressed. Photoresist shape 9, featuring openings which expose portions of STI regions 5, and a portion of a non-STI region located between STI regions, is used as a mask to allow an anisotropic RIE procedure to selectively remove these exposed silicon oxide regions, resulting in definition of initial self-aligned opening 10a. This is schematically shown in FIG. 6. The selective anisotropic RIE procedure is performed using $CHF_3$ as an etchant for silicon oxide, featuring an etch rate ratio of silicon oxide to silicon nitride between about 15 to 1, to 20 to 1. The desirable etch rate selectivity allows between about 50 to 100 Angstroms of exposed silicon oxide in STI regions 5, to be removed, while exposed portions of thinner, silicon oxide shape 8c, are completely removed, with the selective dry etch procedure terminating at the appearance of silicon nitride layer 7. The thickness of remaining silicon oxide, in the partially etched STI regions is between about 1000 to 2000 Angstroms.

Figure 7:
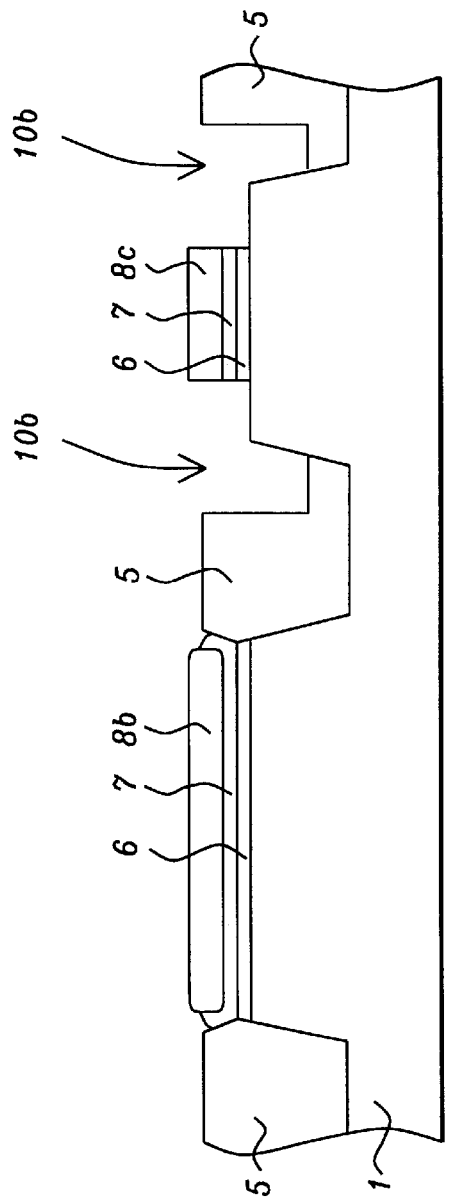

After removal of photoresist shape 9, via plasma oxygen ashing procedures, removal of exposed portions of silicon nitride layer 7, is addressed. A hot phosphoric acid solution is employed to selectively remove portions of silicon nitride layer 7, not protected by overlying silicon oxide shape 8c. The pull back or removal of silicon nitride layer 7, exposes portions of silicon dioxide layer 6, which are then removed via exposure to a buffered hydrofluoric (BHF), or a dilute hydrofluoric (DHF) solution, resulting in final self-aligned opening 10b, schematically shown in FIG. 7. The removal of thin silicon dioxide layer 6, via wet etch procedures, did not significantly thin thicker silicon oxide shapes 8b, and 8c. The ability to define final self-aligned opening 10b, via selective dry and wet etch procedures, prevented portions of semiconductor substrate 1, from exposure to these procedures, thus avoiding possible silicon damage which in turn can result in subsequent device yield and reliability shortcomings.

Figure 8:
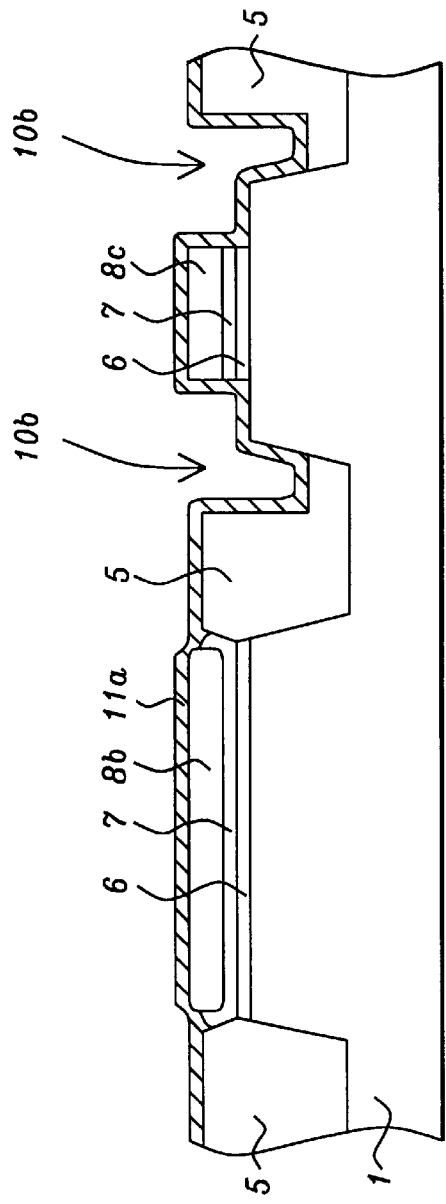

Polysilicon layer 11a, is next deposited via LPCVD procedures to a thickness between about 300 to 1000 Angstroms, contouring all surfaces of final self-aligned opening 10b, and residing on the smooth top surface topography presented by silicon oxide shape 8b, in the non-buried stack capacitor region. This is schematically shown in FIG. 8. Polysilicon layer 11a, is grown intrinsically, than doped via implantation of $BF_2$ ions, at an energy between about 5 to 20 KeV, at a dose between about 1E14 to 1E15 atoms/$cm^2$, converting intrinsic polysilicon layer 11a, to a P+ polysilicon layer.

Figure 9:
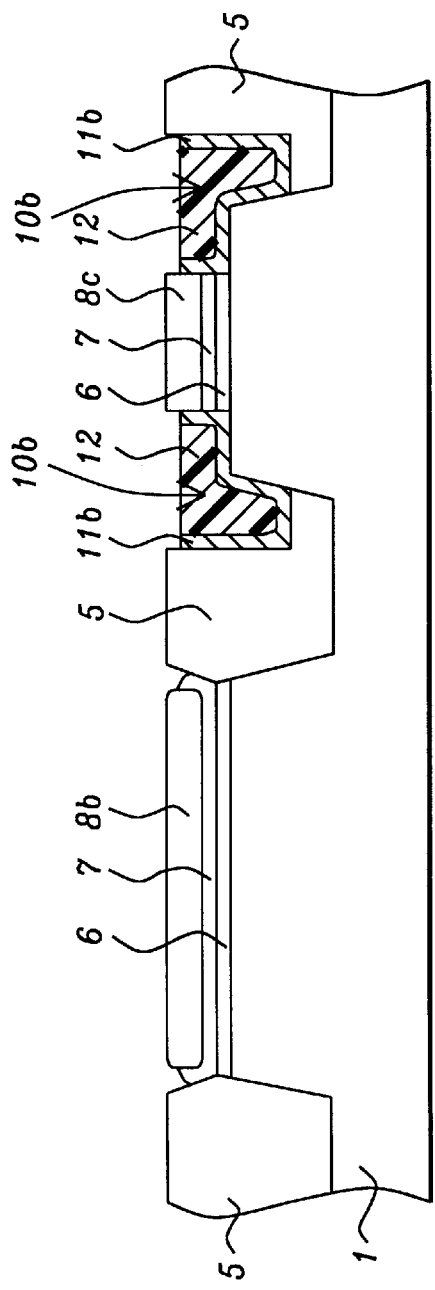

A photoresist layer is next applied at a thickness great enough to completely fill final self-aligned openings lob. An initial phase of a CMP procedure is now employed removing portions of the photoresist layer from the top surface of polysilicon layer 11a, in regions where polysilicon layer 11a, resided on planar silicon oxide top surfaces, such as the top surfaces of silicon oxide shape 8b, silicon oxide shape 8c, and STI regions 5. The initial phase of the CMP procedure results in photoresist plugs 12, residing on the portions of polysilicon layer 11a, located in final self-aligned openings 10b. The final phase of the CMP procedure is next performed removing portions of polysilicon layer 11a, not protected by photoresist plugs 12, resulting in polysilicon bottom electrode structure, or polysilicon storage node structure 11b, shown schematically in FIG. 9. The ability to form and maintain a planar top surface topography, via use of silicon oxide shapes 8b, 8c, and STI regions 5, allowed easy and complete removal of polysilicon from the top surface of these silicon oxide shapes, thus eliminating possible polysilicon stringers that may have been formed as a result of a CMP procedure applied to a less planar surface. The final phase of the CMP procedure includes an additional polishing cycle employed to insure complete removal of all exposed polysilicon regions. This results in top portions of the vertical features of polysilicon storage node structure 11b, now residing below the top surface of the silicon oxide or STI shapes. Photoresist plugs 12, are now removed via plasma oxygen ashing procedures.

Figure 10:
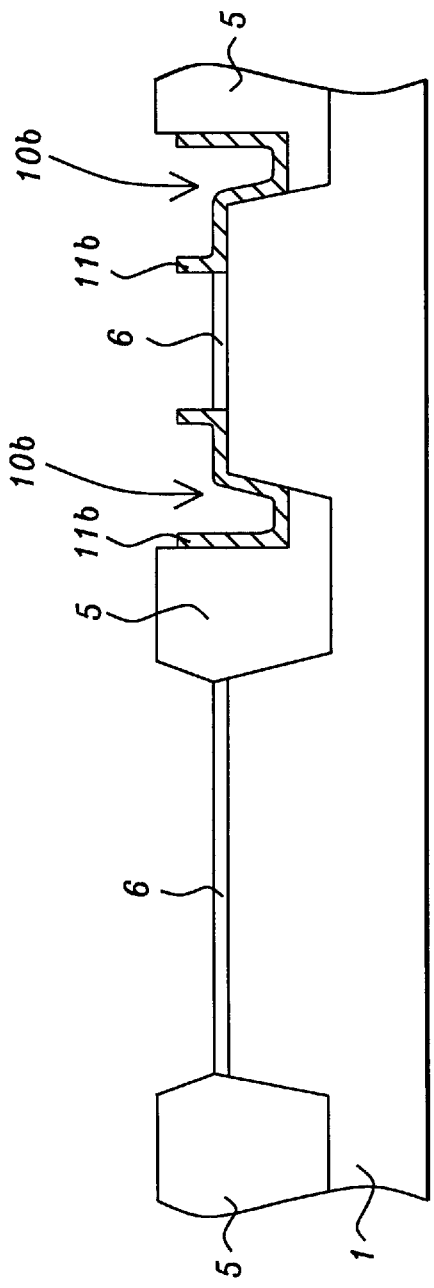

The shapes responsible for planarization, silicon oxide shapes 8b, and 8c, are now selectively removed via dry etch procedures, using $CHF_3$ as an etchant, with the selective dry etch procedure terminating at the appearance of silicon nitride layer 7. If desired a BHF or DHF wet etch procedure can be used to selectively remove the silicon oxide shapes. STI regions 5, are exposed during the removal of silicon oxide shapes 8b and 8c, however the removal of the thinner of silicon oxide shapes, compared to the thicker STI regions, result in little loss of silicon oxide in STI regions 5, during this procedure. Silicon nitride layer 7, paramount to this invention as an etch stop in aspects of defining self-aligned openings, is next removed via a selective wet etch procedure, employing a hot phosphoric acid solution. The wet etch procedure used to selectively remove silicon nitride terminates at the appearance of silicon dioxide layer 6. The result of these removal procedures is schematically shown in FIG. 10.

Figure 11:
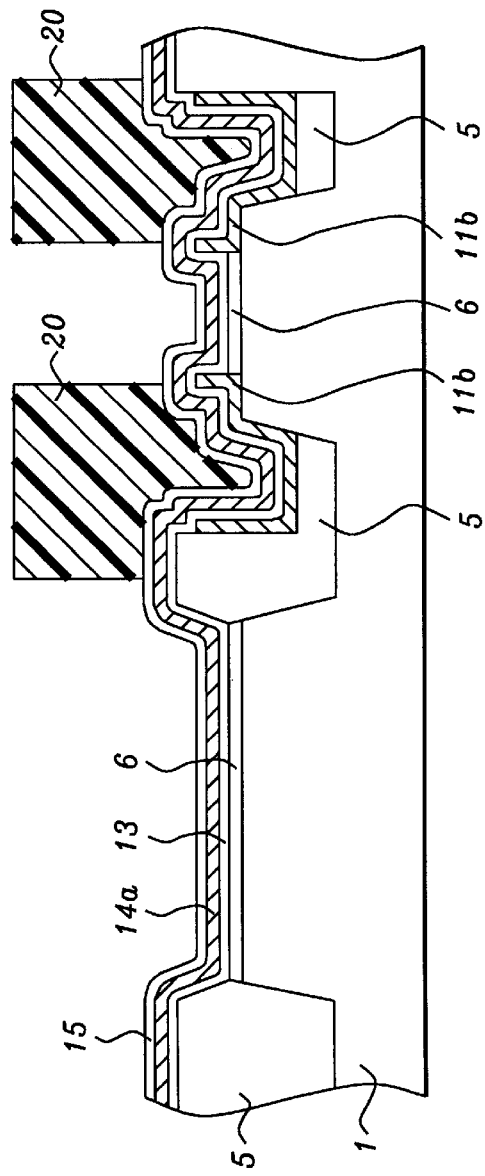

Capacitor dielectric layer 13, such as an oxidized silicon nitride (NO) layer, is next formed on the top surface of polysilicon storage node structure 11b, at a thickness between about 50 to 80 Angstroms. This is accomplished via deposition of a silicon nitride layer at a thickness between about 40 to 70 Angstroms, via LPCVD or PECVD procedures, followed by thermal oxidation of a top portion of the silicon nitride layer. If desired capacitor dielectric layer can also be an oxidized silicon nitride layer on silicon oxide (ONO), or a deposited tantalum oxide layer. Intrinsic polysilicon layer 14a, is next deposited via LPCVD procedures at a thickness between about 300 to 1500 Angstroms, followed by implantation of $BF_2$ ions at an energy between about 5 to 20 KeV, and at a dose between about 1E14 to 1E15 atoms/$cm^2$, creating an P+ doped polysilicon layer 14a. Insulator layer 15, to be used as a hard mask layer for subsequent fabrication sequences, comprised of either silicon nitride or a silicon oxynitride-silicon oxide composite, is then formed on polysilicon layer 14a, via LPCVD or PECVD procedures, at a thickness between about 200 to 800 Angstroms. Photoresist shapes 20, shown schematically in FIG. 11, to be used as an etch mask for definition of a capacitor top plate, are then formed on the top surface of specific portions of insulator layer 20.

Figure 12:
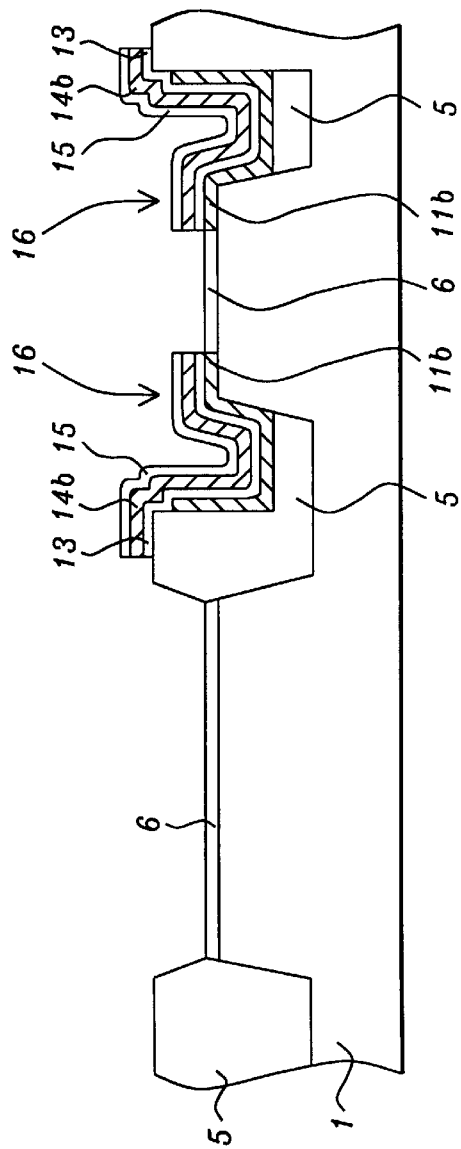

An anisotropic RIE procedure is now employed to: selectively remove exposed portions of insulator layer 20, using $CHF_3$ as an etchant; selectively remove exposed portions of polysilicon layer 14a, using $Cl_2$ as an etchant; and to selectively remove exposed portions of capacitor dielectric layer 15, again using $CHF_3$ as an etchant, with the RIE procedure terminating at the appearance of the top surface of silicon dioxide layer 6. The anisotropic RIE procedure results in the definition of buried stack capacitor structure 16, overlaid by insulator layer 15, with buried stack capacitor structure 16, comprised of polysilicon upper plate structure 14b, of capacitor dielectric layer 13, and of polysilicon storage node structure 11b. This is schematically shown in FIG. 12. After definition of buried stack capacitor structure 16, photoresist shape 20, is removed via plasma oxygen ashing procedures.

The ability to fabricate a buried stack capacitor structure in a self-aligned opening without semiconductor damage, sometimes encountered during well implant procedures and during capacitor opening procedure, and without polysilicon stringers, possibly formed during definition of the polysilicon storage node structure, is a result of the unique process sequences detailed in this present invention, such as a stack of insulator layers allowing selective definition of the capacitor opening to be realized, and such as the use of planarizing silicon oxide shapes, allowing a CMP procedure to define the polysilicon storage node structure on a planar topography.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a buried stack capacitor structure on a semiconductor substrate, comprising the steps of:

forming a composite insulator layer on said semiconductor substrate;

forming shallow trench shapes in said composite insulator layer and in a top portion of said semiconductor substrate;

filling said shallow trench shapes with an insulator layer, resulting in a shallow trench isolation (STI) regions;

growing a pad silicon dioxide layer on portions of said semiconductor substrate not occupied by said STI regions;

forming an implanted well region in portions of said semiconductor substrate not occupied by said STI regions;

depositing a silicon nitride layer;

depositing a silicon oxide layer;

performing a chemical mechanical polishing procedure exposing regions of said silicon nitride layer located on top surface of said STI regions and resulting in a planar top surface topography, comprised of portions of said silicon oxide layer on portions of said silicon nitride layer, both located overlying said pad silicon dioxide layer in regions between silicon nitride covered STI regions;

removing portions of said silicon nitride layer from top surface of said STI regions;

performing a dry etch patterning procedure to remove a top portion of said insulator layer from a peripheral area of an STI region, and to remove an area of said silicon oxide layer located adjacent to said peripheral area of said STI region, exposing a region of said silicon nitride layer, resulting in definition of an initial self-aligned opening, removing exposed regions of said silicon nitride layer and underlying region of said pad silicon dioxide layer, resulting in a final self-aligned opening in which a bottom portion of a peripheral region of said STI region, and a portion of said semiconductor substrate located adjacent to said peripheral area of said STI region, is exposed;

forming a storage node structure in said final self-aligned opening;

forming a capacitor dielectric layer on said storage node structure; and forming an upper plate structure resulting in said buried stacked capacitor structure comprised of said upper plate structure, said capacitor dielectric layer, and said storage node structure.

2. The method of claim 1, wherein said composite insulator layer is comprised of an underlying silicon dioxide layer, obtained via thermal oxidation procedures at a thickness between about 100 to 200 Angstroms, and comprised of a silicon nitride layer, obtained via LPCVD or PECVD procedures at a thickness between about 1000 to 2000 Angstroms.

3. The method of claim 1, wherein said shallow trench shapes are formed in said composite insulator layer, and in said semiconductor substrate to a depth between about 3000 to 5000 Angstroms, via a dry etching procedure using $CF_4$ as an etchant for silicon nitride and silicon oxide, and using $Cl_2$ or $SF_6$ as an etchant for silicon.

4. The method of claim 1, wherein said insulator layer used to fill said shallow trench shapes is a silicon oxide layer, obtained via LPCVD or PECVD procedures at a thickness between about 6000 to 8000 Angstroms, using tetraethylorthosilicate (TEOS) as a source.

5. The method of claim 1, wherein said pad silicon oxide layer is thermally grown to a thickness between about 100 to 200 Angstroms.

6. The method of claim 1, wherein said silicon nitride layer is obtained via LPCVD or PECVD procedures, at a thickness between about 100 to 1000 Angstroms.

7. The method of claim 1, wherein said silicon oxide layer is obtained via PECVD procedures, at a thickness between about 2000 to 4000 Angstroms, using tetraethylorthosilicate (TEOS) as a source.

8. The method of claim 1, wherein said initial self-aligned opening, defined in top portion of said insulator layer located in a peripheral area of an STI region, and defined in an area of said silicon oxide layer located adjacent to said peripheral area of said STI region, is accomplished via an anisotropic RIE procedure, using $CHF_3$ as an etchant for silicon oxide, with an etch rate ratio of silicon oxide to silicon nitride between about 15 to 1, to 20 to 1.

9. The method of claim 1, wherein the thickness of said insulator layer removed during anisotropic RIE definition of said initial self-aligned opening, is between about 1000 to 2000 Angstroms.

10. The method of claim 1, wherein regions of said silicon nitride layer, exposed in said initial self-aligned opening, are removed using a hot phosphoric acid solution.

11. The method of claim 1, wherein said storage node structure is defined from a polysilicon layer which in turn is obtained intrinsically via LPCVD procedures at a thickness between about 300 to 1000 Angstroms, then doped via implantation of $BF_2$ ions at an energy between about 5 to 20 KeV, and at a dose between about 1E14 to 1E15 atoms/$cm^2$.

12. The method of claim 1, wherein said storage node structure is defined via a chemical polishing (CMP) procedure, applied to regions of a polysilicon layer located on an underlying planer top surface topography.

13. The method of claim 1, wherein said capacitor dielectric layer is an oxidized silicon nitride (NO) layer, obtained at a thickness between about 50 to 80 Angstroms, via oxidation of a top portion of a silicon nitride layer which in turn is obtained via LPCVD or PECVD procedures to a thickness between about 40 to 70 Angstroms.

14. The method of claim 1, wherein said upper plate structure is a polysilicon upper plate structure, formed from a polysilicon layer which in turn is obtained intrinsically via LPCVD procedures at a thickness between about 300 to 1500 Angstroms, then doped via implantation of $BF_2$ ions at an energy between about 5 to 20 KeV, at a dose between about 1E14 to 1E15 atoms/$cm^2$.

15. A method of fabricating a buried stack capacitor structure on a semiconductor substrate, featuring a self-aligned opening for accommodation of said buried stack capacitor structure, and featuring definition of a polysilicon storage node structure on a planar top surface topography, comprising the steps of:

growing a first silicon dioxide on said semiconductor substrate;

depositing a first silicon nitride layer;

performing a first dry etch procedure to form shallow trench shapes in said first silicon nitride layer, in said first silicon dioxide layer, and in a top portion of said semiconductor substrate, depositing a first silicon oxide layer completely filling said shallow trench shapes;

performing a first chemical mechanical polishing (CMP) procedure to remove portions of said first silicon oxide layer from top surface of said first silicon nitride layer, resulting in an insulator filled, shallow trench isolation (STI) regions;

removing said first silicon nitride layer, and removing said first silicon dioxide layer;

growing a second silicon dioxide layer on regions of said semiconductor substrate not occupied by said STI regions;

forming an implanted well region in portions of said semiconductor substrate not occupied by said STI regions;

depositing a second silicon nitride layer on said second silicon dioxide layer and on top surface of said STI regions;

depositing a second silicon oxide layer on said second silicon nitride layer;

performing a first chemical mechanical polishing (CMP) procedure exposing regions of said second silicon nitride layer located on top surface of said STI regions, resulting in said planar top surface topography for composite insulator shapes comprised of said second silicon oxide layer, of said second silicon nitride layer, and of said second silicon dioxide layer, located in regions between silicon nitride covered STI regions;

removing portions of said second silicon nitride layer from top surface of said STI regions;

performing a second dry etch procedure removing a top portion of said first silicon oxide layer from a peripheral area of an STI region exposing a bottom portion of said STI region, and removing an area of said second silicon oxide layer located adjacent to said peripheral area of said STI region, exposing an underlying region of said second silicon nitride layer, resulting in the definition of an initial self-aligned opening;

removing exposed region of said second silicon nitride exposing an underlying region of said second silicon dioxide layer;

removing exposed region of said second silicon dioxide layer, resulting in a final self-aligned opening comprised of said bottom portion of said peripheral area of said STI region, and comprised of a portion of said semiconductor substrate located adjacent to said peripheral area of said STI region;

depositing a first polysilicon layer in said final self-aligned opening and on adjacent said top planar top surface top surface topography;

performing a first ion implantation procedure to form a first doped polysilicon layer;

forming photoresist plugs on portions of said first doped polysilicon layer located in said final self-aligned opening;

performing a second CMP procedure removing portions of said first doped polysilicon layer from said planar top surface topography, resulting in definition of a polysilicon storage node structure in said final self-aligned opening;

removing said photoresist plugs;

forming a capacitor dielectric layer on said polysilicon storage node structure;

depositing a second polysilicon layer;

performing a second ion implantation procedure to form a second doped polysilicon layer;

performing a third dry etch procedure to define a polysilicon upper plate structure from said second doped polysilicon layer, resulting in said buried stacked capacitor structure comprised of said polysilicon upper plate structure, said capacitor dielectric layer, and said polysilicon storage node structure.

16. The method of claim 15, wherein said shallow trench shapes are formed in said first silicon nitride layer, in said first silicon dioxide layer, and formed to a depth in said semiconductor substrate of between about 3000 to 5000 Angstroms, via said first dry etching procedure using $CF_4$ as an etchant for silicon nitride and silicon oxide, and using $Cl_2$ or $SF_6$ as an etchant for silicon.

17. The method of claim 15, wherein said first silicon oxide layer, used to fill said shallow trench shapes, is obtained via LPCVD or PECVD procedures at a thickness between about 6000 to 8000 Angstroms, using tetraethylorthosilicate (TEOS) as a source.

18. The method of claim 15, wherein said second silicon dioxide layer is thermally grown to a thickness between about 100 to 200 Angstroms.

19. The method of claim 15, wherein said second silicon nitride layer is obtained via LPCVD or PECVD procedures, at a thickness between about 100 to 1000 Angstroms.

20. The method of claim 15, wherein said second silicon oxide layer is obtained via PECVD procedures, at a thickness between about 2000 to 4000 Angstroms, using tetraethylorthosilicate (TEOS) as a source.

21. The method of claim 15, wherein said second dry etch procedure used to form said initial self-aligned opening, in top portion of said first silicon oxide layer located in a peripheral area of an STI region, and in an area of said second silicon oxide layer located adjacent to said peripheral area of said STI region, is a selective anisotropic RIE procedure performed using $CHF_3$ as an etchant for silicon oxide, with an etch rate ratio of silicon oxide to silicon nitride between about 15 to 1, to 20 to 1.

22. The method of claim 15, wherein the thickness of said first silicon oxide layer located in said bottom portion of said STI region is between about 1000 to 2000 Angstroms.

23. The method of claim 15, wherein regions of said second silicon nitride layer, exposed in said initial self-aligned opening, are removed using a hot phosphoric acid solution.

24. The method of claim 15, wherein said first doped polysilicon layer is obtained via deposition of an intrinsic, first polysilicon layer via LPCVD procedures at a thickness between about 300 to 1000 Angstroms, followed by implantation of $BF_2$ ions, at an energy between about 5 to 20 KeV, at a dose between about 1E14 to 1E15 atoms/$cm^2$.

25. The method of claim 15, wherein said capacitor dielectric layer is an oxidized silicon nitride (NO) layer, obtained at a thickness between about 50 to 80 Angstroms, via oxidation of a top portion of a silicon nitride layer which in turn is obtained via LPCVD or PECVD procedures to a thickness between about 40 to 70 Angstroms.

26. The method of claim 15, wherein second doped polysilicon layer is obtained via deposition of an intrinsic, second polysilicon layer, via LPCVD procedures at a thickness between about 300 to 1500 Angstroms, followed by implantation of $BF_2$ ions, at an energy between about 5 to 20 KeV, at a dose between about 1E14 to 1E15 atoms/$cm^2$.

* * * * *